United States Patent [19]
Lee

[11] Patent Number: 6,020,091
[45] Date of Patent: Feb. 1, 2000

[54] HARD ETCH MASK

[75] Inventor: Gill Yong Lee, Fishkill, N.Y.

[73] Assignee: Siemens Aktiengesellschaft, Munich, Germany

[21] Appl. No.: 08/940,891

[22] Filed: Sep. 30, 1997

[51] Int. Cl.[7] ................................................. G03F 9/00
[52] U.S. Cl. .............................................................. 430/5
[58] Field of Search .......................... 430/5; 438/243, 438/386; 378/35

[56] References Cited

U.S. PATENT DOCUMENTS

| | | | |
|---|---|---|---|
| 5,545,588 | 8/1996 | Yoo | 430/5 |
| 5,614,431 | 3/1997 | DeBrosse | 437/52 |
| 5,776,808 | 12/1996 | Muller et al. | 438/243 |

*Primary Examiner*—S. Rosasco
*Attorney, Agent, or Firm*—Stanton C. Braden

[57] ABSTRACT

A hard etch mask comprising phosphorus doped silicate glass for reactive ion etching of a substrate to form trenches therein.

12 Claims, 3 Drawing Sheets

HARD ETCH MASK

FIELD OF INVENTION

The invention generally relates to device fabrication and, in particular, to an improved hard etch mask for etching, for example, deep trenches such as those employed in trench capacitors.

BACKGROUND OF INVENTION

In device fabrication, insulating, semiconducting, and conducting layers are formed on a substrate. The layers are patterned to create features and spaces to form devices, such as transistors, capacitors, and resistors. These devices are then interconnected to achieve a desired electrical function.

In some applications, trenches or deep trenches are created in the substrate to form, for example, trench capacitors. Creation of the trenches is achieved by an anisotropic etch such as reactive ion etch (RIE). A hard mask layer is provided and patterned to serve as a RIE mask. Typically, additional layers such as a pad nitride and a pad oxide are provided underneath the hard mask layer. The nitride layer serves as a polish stop layer for subsequent processes and the pad oxide layer promotes adhesion and to reduce stress between the silicon substrate and the pad nitride layer. As such, the hard mask layer needs to be dense enough to withstand the bombardment of ions during the RIE. Additionally, the mask layer should have a substantially higher etch rate than the polish layer, enabling it to be removed without removing the other pad layers.

Conventionally, TEOS oxide is used as a hard mask layer. TEOS is sufficiently dense to withstand the RIE. However, TEOS cannot be etched selectively to oxide. This can cause problems during removal of the TEOS hard mask. For example, removal of the TEOS hard mask also etches the pad oxide underneath the pad nitride, resulting in the separation of the pad nitride from the substrate.

As evidenced from the above discussion, it is desirable to provide a pad stack with a hard mask layer that can be removed selective to oxide.

SUMMARY OF INVENTION

The invention relates to reactive ion etching of a substrate to form, for example, deep trenches (DTs). In accordance with one embodiment, a pad stack including a hard mask layer comprising phosphorus doped silicate glass (PSG) is formed over the surface of the substrate. The PSG is formed over a pad oxide and a pad nitride layer, forming the pad stack.

In one embodiment, the PSG comprises a concentration of phosphorus (P) which produces a sufficient etch selectivity with the pad oxide layer and less than that which produces an unstable layer. For ozone based PSG, the concentration of P is greater than about 1 wt % to avoid surface dependency.

The pad stack is patterned to expose regions of the substrate where DTs are to be formed. The exposed substrate regions are then etched by a reactive ion etch (RIE), using the PSG to serve as a DT etch mask. As such, the RIE forms DTs of a desired depth, which are used to form trench capacitors.

DETAILED DESCRIPTION OF THE INVENTION

The present invention relates to a hard etch mask. For purposes of illustration, the present invention is described in the context of a pad stack used in the fabrication of deep trenches. The deep trenches are employed as trench capacitors for memory cells in a random access memory integrated circuit (IC). However, the invention is significantly broader and is applicable to a pad mask that can be removed selective to oxide.

Figure 1:
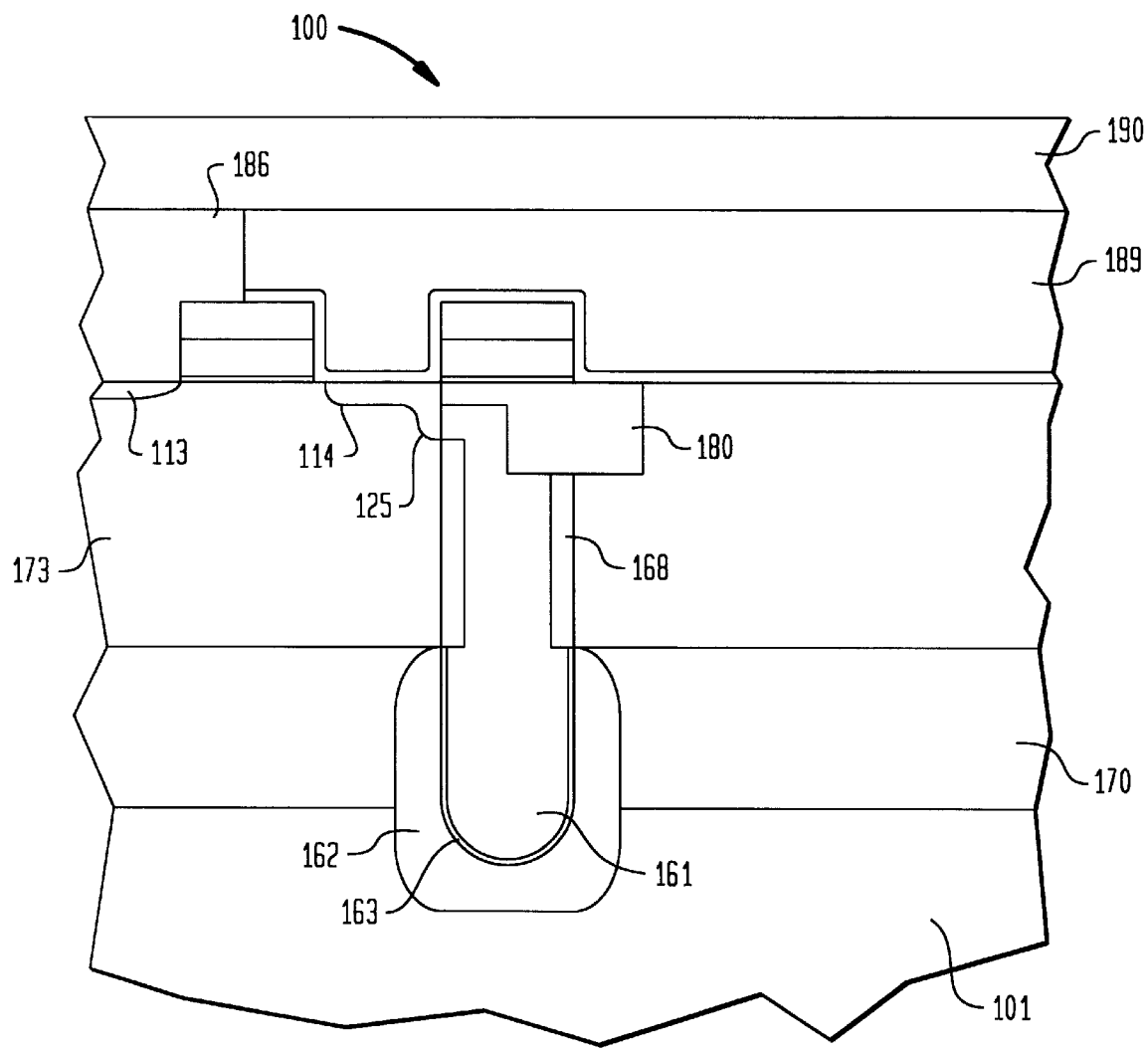
FIG. 1 shows a trench capacitor memory cell.

For convenience, a description of a trench capacitor dynamic RAM (DRAM) cell is provided. Referring to FIG. 1, a trench capacitor DRAM cell is shown. Such DRAM cell is described in, for example, Nesbit et al., A $0.6\,\mu m^2$ 256 Mb Trench DRAM Cell With Self-Aligned Buried Strap (BEST), IEDM 93-627, which is herein incorporated by reference for all purposes. As shown, the DRAM cell includes a trench capacitor 160 formed in a substrate 101. The trench is filled with, typically, polysilicon (poly) 161 that is heavily doped with n-dopants. The poly serves as one plate of the capacitor and is typically referred to as a "storage node." A buried plate 165 doped with n-type dopants surrounds the lower portion of the trench. In the upper portion of the trench is a collar 168 which is used to reduce parasitic leakage. A node dielectric 163 separates the two plates of the capacitor. A buried well 170 comprising n-type dopants is provided to connect the buried plates of the DRAM cells in the array. Above the buried well is a p-well 173. The p-well serves to reduce vertical leakage.

The DRAM cell also comprises a transistor 110. The transistor includes a gate 112 and source 113 and drain 114 diffusion regions comprising n-type dopants. The designation of drain and source depends on the operation of the transistor. For convenience, the terms "drain" and "source" are used herein interchangeably. Connection of the transistor to the capacitor is achieved via a diffusion region 125, referred to as the "node diffusion". The gate stack, also referred to as the "wordline", typically comprises poly 166 and nitride 468 layers. Alternatively, layer 166 is a polycide layer which comprises silicide, such as molybdenum ($MoSi_x$), tantalum ($TaSi_x$), tungsten ($WSi_x$), titanium ($TiSi_x$), or cobalt ($CoSi_x$), over a layer of poly to reduce wordline resistance. In one embodiment, the polycide layer comprises $WSi_x$ over poly. A nitride liner 169 covers the gate stack and substrate. The nitride layer 168 and nitride liner serves as an etch or polish stop layer for subsequent processing.

A shallow trench isolation (STI) 180 is provided to isolate the DRAM cell from other cells or devices. As shown, a wordline 120 is formed over the trench and isolated therefrom by the STI. Wordline 120 is referred to as the "passing wordline". Such configuration is referred to as a folded bitline architecture.

An interlevel dielectric layer 189 is formed over the wordlines. A conductive layer 190, representing a bitline, is formed over the interlevel dielectric layer. A bitline contact opening 186 is provided in the interlevel dielectric layer to contact the source 113 to the bitline 190.

A plurality of such cells is configured in an array. The array of cells is interconnected by wordlines and bitlines.

Access to a cell is achieved by activating the cell's corresponding wordline and bitline.

Figure 2A:
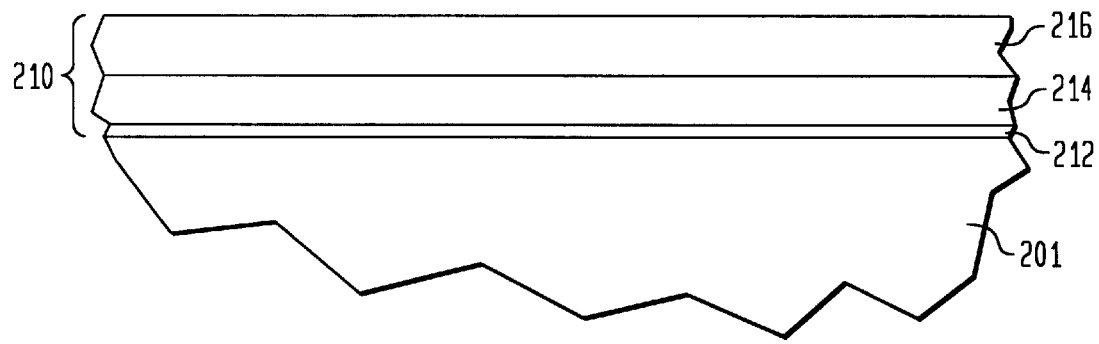
FIGS. 2a–b show a pad stack including a hard mask in accordance with one embodiment of the invention.

Referring to FIG. 2a, a cross section of a portion of a substrate 201 used to form an IC is shown. The IC is, for example, a memory IC such as a random access memory (RAM), a dynamic RAM (DRAM), a synchronous DRAM (SDRAM), a static RAM (SRAM), and a read only memory (ROM). The IC can also be a logic circuit such as a programmable logic array (PLA), an application specific IC (ASICs), a merged DRAM-logic circuit, or any other circuit device.

Typically, numerous ICs are fabricated on a semiconductor substrate in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

The substrate 201, for example, is a silicon wafer. Other substrates, such as gallium arsenide, germanium, silicon on insulator (SOI), or other semiconductor materials, are also useful. The substrate, for example, may be lightly or heavily doped with dopants of a pre-determined conductivity to achieve the desired electrical characteristics.

As shown, a pad stack 210 is provided over the surface of the substrate. The pad stack includes, for example, a pad oxide layer 212 formed on the surface of the substrate. The pad oxide is formed by, for example, thermal oxidation. The pad oxide is sufficiently thick to reduce stress and promote adhesion between a pad etch stop layer and the substrate.

Above the pad oxide is provided a pad etch stop layer 214. The pad etch stop layer serves as an etch stop or polish stop layer for subsequent processing of the IC. In one embodiment, the pad etch stop layer comprises silicon nitride ($SiN_4$). The nitride layer is formed by, for example, low pressure chemical vapor deposition (LPCVD). Other techniques for depositing the nitride layer are also useful. Typically, the pad nitride layer is about 2,200 Å.

Above the pad nitride is formed a hard etch mask layer 216. In accordance with the invention, the hard etch mask comprises phosphorus doped silicate glass (PSG). The phosphorus doped silicate glass (PSG) is deposited by various chemical vapor deposition (CVD) techniques. Such CVD techniques include, for example, plasma enhanced CVD (PECVD). PECVD of PSG is described in, for example, Applied Materials P-500 PECVD P-TEOS, which is herein incorporated by reference for all purposes. PECVD involves using silane or TEOS gas with any phosphorus (P) dopant source. Phosphorus dopant source, such as tri-methyl phosphate (TMP) is also useful.

Subatmospheric pressure CVD (SACVD) or atmospheric pressure (APCVD) techniques for forming a PSG film are also useful. Such techniques employ, for example, ozone (O3) and TEOS gases with any liquid type P dopant source. APCVD and SACVD techniques are described in, for example, Applied Materials Ozone-TEOS, which is herein incorporated by reference for all purposes. Other known deposition techniques for forming the PSG film are also useful.

The thickness of the PSG layer is sufficient to serve as a hard etch mask. The thickness can vary depending on the application. In one embodiment, the PSG layer is sufficiently thick to serve as an etch mask for a reactive ion etch (RIE) used to form, for example, deep trenches. Typically, the thickness of the PSG layer is about 3,000–20,000 Å, preferably about 5,000–9,000 Å, and more preferably about 7,000 Å.

The P concentration of the PSG layer is sufficiently high to achieve a desired wet etch selectivity with oxide. The higher the P concentration, the higher the etch selectivity with oxide. However, if the P concentration exceeds an upper limit, the PSG tends to form phosphoric acid crystals on the surface. Such acid crystals make the layer unstable. The acid crystals can be removed by an anneal. Typically, the upper limit is about 11%. Since PSG is sufficiently hard, an anneal to densify the film is not required. As such, depositing a PSG file with less than or equal to about 10–11 wt % P concentration can be achieved without an anneal.

$O_3$ based deposited films are found to have strong surface dependency. As a result, pretreatment of the surface may be required prior to deposition. However, it has been found that P concentration of greater than or equal to about 1% results in a PSG film which does not have surface dependency.

In one embodiment, the PSG comprises a P concentration of about 3–11 wt %, preferably about 5–9 wt %, and more preferably about 7 wt %. Of course, the P concentration can be varied to achieve a desired wet etch rate. Although a concentration of P exceeding the upper limit would achieve a higher wet etch rate, an anneal would be required to stabilize the film. Also, wet etch selectivity of the PSG film can be enhanced by varying the deposition conditions. Typically, decreasing the power and/or temperature produces a PSG film with higher etch selectivity to oxide. In one embodiment, the PSG is deposited at a temperature 200–600° C. and RF power between 100–3500 W.

Figure 2B:
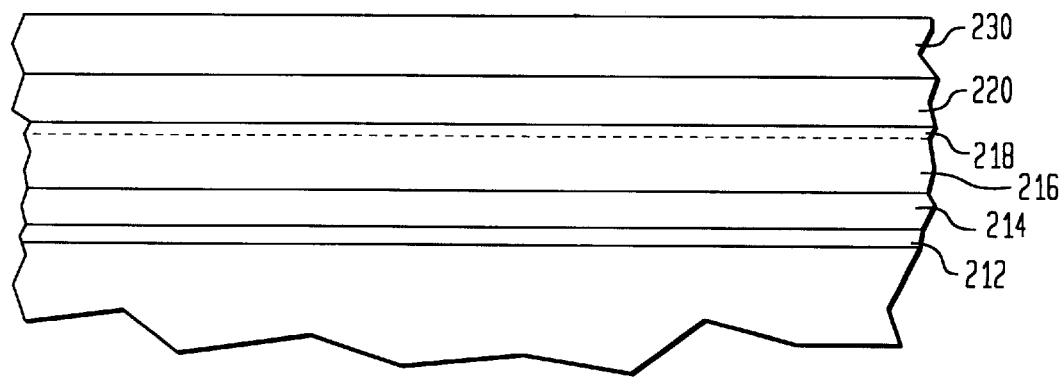
Figure 3:
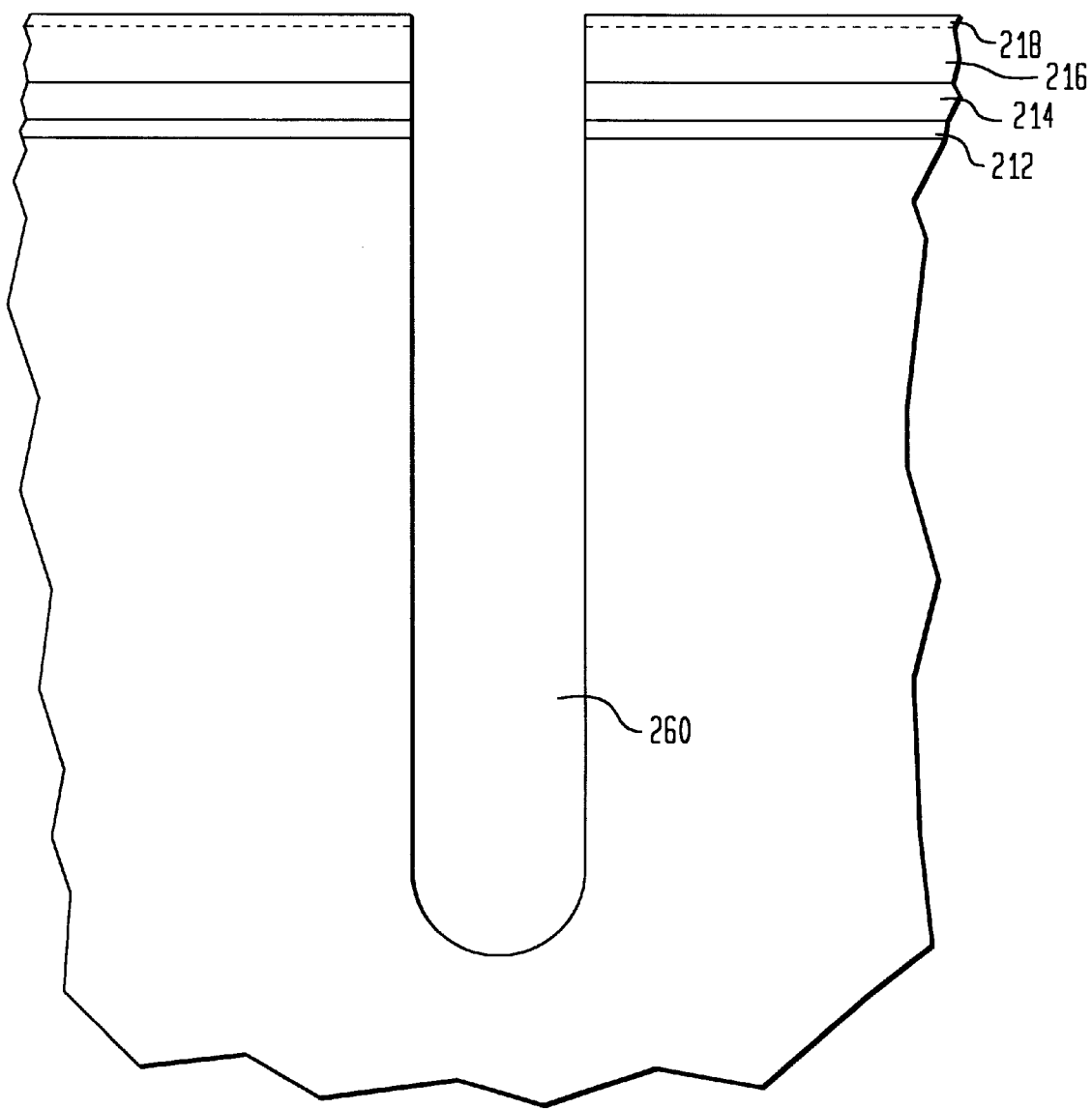
FIG. 3 shows a region with a trench.

Patterning of the pad stack to form trenches is achieved using conventional lithographic and etch techniques. Referring to FIG. 2b, a photoresist layer 230 is deposited to facilitate patterning of the pad stack. To improve lithographic resolution, antireflective coating (ARC) film 220 is provided underneath the photoresist.

In one embodiment, the ARC comprises an organic material ARC such as bottom anti-reflection layer (BARL). A barrier layer 218 may be provided to prevent the PSG from reacting with the BARL and/or resist layers. For example, a P concentration above 8 wt % may cause resist poisoning depending on the resist used. The barrier layer comprises, for example, undoped silicate glass. This allows the barrier layer to be formed in the same tool by switching off the dopant source. A barrier layer between about 200–5,000 Å, and preferably about 500 Å is typically sufficient to prevent this reaction.

The use of inorganic ARC is also useful. The inorganic ARC comprises, for example, a dielectric material such as oxynitride. The inorganic ARC may also serve as a barrier layer to prevent a potential reaction between the PSG and the resist layer. The use of inorganic ARC advantageously allows the deposition of the PSG mask and ARC layers in the same tool.

Referring to FIG. 2c, the photoresist layer is selectively exposed with an exposure source and mask. Depending on whether the resist is the positive or negative type, either the exposed or unexposed portions layer are removed during development, leaving a region of pad stack unprotected. The unprotected region corresponds to the area where a trench is to be formed.

The pad stack in the unprotected region is then etched by an RIE, exposing the substrate surface below. After the patterning of the pad stack, the resist layer is removed. If an organic ARC (BARL) is used, the BARL layer is also removed. If an inorganic ARC is used, the dielectric layer may be left over the PSG layer.

The substrate is then etched by an RIE, using the pad stack as a mask, to form a trench 260. The trench, for example, is used to form a trench capacitor for a memory cell. The RIE erodes the thin barrier or the inorganic ARC layer on the PSG mask during the formation of the trench.

A wet etch is then used to remove the PSG mask layer. The wet etch employs a diluted HF etchant. The diluted etchant is, for example, about 50:1 HF. The diluted HF etchant is able to achieve a sufficiently high etch selectively with oxide. The wet etch selectivity of the PSG to oxide is about 50:1–500:1, preferably 50:1. Of course, the actual etch selectivity depends on the P concentration.

The wet etch selectivity is sufficient to remove the PSG layer without affecting the pad oxide 212. This advantageously enables the hard mask layer to be removed at an earlier stage of processing, thus avoiding excessive erosion problems associated with removing the hard mask layer at a later stage of processing.

At this point, processing is continued to form a DRAM cell, as shown in FIG. 1, fabricated using conventional techniques such as those described in, for example, Nesbit et al., A 0.6 $\mu m^2$ 256 Mb Trench DRAM Cell With Self-Aligned Buried Strap (BEST), IEDM 93-627, which is already herein incorporated by reference for all purposes. This includes forming the buried plate, node dielectric, collar, filling the trench with, for example, doped poly, forming the buried strap, defining the isolation regions to form the STIs, depositing the various layers comprising the gate stack and patterning these layers to form the gate conductors that represent wordlines, depositing an interlevel dielectric layer, creating the contact opening, and forming the bitline.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

I claim:

1. A pad stack for etching a substrate comprising:

a pad oxide layer formed on the substrate;

a pad stop layer formed on the pad oxide layer; and a PSG hard mask layer formed on the pad stop layer, the PSG hard mask layer for providing an etch mask for a reactive ion etch for forming deep trenches.

2. The pad stack as recited in claim 1, wherein the PSG layer is from about 3,000 Å to about 20,000 Å in thickness.

3. The pad stack as recited in claim 1, wherein the PSG layer is from about 5,000 Å to about 9,000 Å in thickness.

4. The pad stack as recited in claim 1, wherein the PSG layer includes a phosphorous concentration such that the PSG layer is selectively etched relative to the pad oxide layer and below a concentration which forms phosphoric acid crystals.

5. The pad stack as recited in claim 4, wherein the PSG layer is selectively etched relative to the pad oxide layer at a ratio of between about 50 to 1 to about 500 to 1.

6. The pad stack as recited in claim 1, wherein the PSG layer includes a phosphorous concentration between about 1% to about 11% by weight.

7. A method of forming deep trenches in a substrate comprising the steps of:

providing a pad stack having a PSG hard mask layer;

patterning the hard mask layer to identify locations for deep trenches; and reactive ion etching the substrate ai the identified locations wherein the hard mask layer provides an etch mask for the reactive ion etching.

8. The method as recited in claim 7, wherein the step of patterning includes the steps of:

forming a resist on the hard mask layer; and developing the resist to form unprotected regions at the identified locations for the deep trenches.

9. The method as recited in claim 8, further comprises the step of depositing an anti-reflection coating on the pad stack prior to forming the resist to improve resolution.

10. The method as recited in claim 9, further comprises the step of depositing a barrier layer on the pad stack prior to forming the resist and depositing the anti-reflection coating.

11. The method as recited in claim 10, further comprises the steps of:

reactive ion etching the pad stack to expose the substrate;

exposing the hard mask; and reactive ion etching the substrate using the hard mask layer as a mask to form deep trenches.

12. The method as recited in claim 7, wherein the pad stack further comprises a pad oxide layer and includes the step of removing the hard mask layer by selective etching relative to the pad oxide layer.

* * * * *